United States Patent [19]

Ganapathy et al.

[11] Patent Number: 5,444,407
[45] Date of Patent: Aug. 22, 1995

[54] MICROPROCESSOR WITH DISTRIBUTED CLOCK GENERATORS

[75] Inventors: Gopi Ganapathy; Stephen C. Horne, both of Austin, Tex.

[73] Assignee: Advanced Micro Devices, Inc., Sunnyvale, Calif.

[21] Appl. No.: 997,991

[22] Filed: Dec. 28, 1992

[51] Int. Cl.6 ............... G06F 1/04; H03K 3/013
[52] U.S. Cl. .................... 327/295; 327/292; 327/415
[58] Field of Search .............. 307/262, 269, 271; 328/56, 62, 105, 153; 327/291, 292, 293, 295, 415, 165, 108

[56] References Cited

U.S. PATENT DOCUMENTS

| | | | |
|---|---|---|---|
| 3,921,079 | 11/1975 | Heffner et al. | 328/105 |
| 4,021,740 | 5/1977 | Horne | 328/62 |
| 4,291,242 | 9/1981 | Schriber | 307/270 |
| 4,661,721 | 4/1987 | Ishidu | 328/105 |
| 4,810,908 | 3/1989 | Suzuki et al. | 307/480 |
| 4,816,700 | 3/1989 | Imel | 307/269 |
| 4,847,516 | 7/1989 | Fujita et al. | 328/62 |
| 4,851,717 | 7/1989 | Yabe | 307/465 |
| 4,866,310 | 9/1989 | Ando et al. | 307/480 |
| 4,922,136 | 5/1990 | Ueda | 307/465.1 |
| 4,929,854 | 5/1990 | Iino et al. | 307/480 |
| 4,965,471 | 10/1990 | Gaboury | 307/446 |
| 4,970,405 | 11/1990 | Hagiwara | 307/269 |
| 5,001,731 | 3/1991 | Atwell, Jr. et al. | 375/107 |
| 5,013,942 | 5/1991 | Nishimura et al. | 307/480 |
| 5,029,279 | 7/1991 | Sasaki et al. | 307/303.1 |
| 5,045,725 | 9/1991 | Sasaki et al. | 307/465 |
| 5,058,132 | 10/1991 | Li | 375/38 |
| 5,073,730 | 12/1991 | Hoffman | 307/480 |
| 5,077,676 | 12/1991 | Johnson et al. | 364/489 |
| 5,079,440 | 1/1992 | Roberts et al. | 307/269 |
| 5,120,989 | 6/1992 | Johnson et al. | 307/269 |
| 5,122,679 | 6/1992 | Ishii et al. | 307/269 |
| 5,133,064 | 7/1992 | Hotta et al. | 307/269 |
| 5,140,184 | 8/1992 | Hamamoto et al. | |
| 5,153,450 | 10/1992 | Ruetz | |

OTHER PUBLICATIONS

Wagner, "Clock System Design", *I.E.E.E. Design & Test of Computers*, (Oct. 1988), vol. 5, No. 5, pp. 9–27.

*Primary Examiner*—Timothy P. Callahan
*Assistant Examiner*—Toan Tran
*Attorney, Agent, or Firm*—Conley, Rose & Tayon

[57] ABSTRACT

A distributed clock generation scheme is provided for a microprocessor that reduces electromagnetic interference and power consumption. Rather than using a single, large internal clock generator circuit that meets the drive requirements of the remaining circuitry upon the microprocessor die, a plurality of smaller clock generator circuits are distributed across the die, each generating clock signals to drive a separate portion of the microprocessor circuitry. Each of the distributed clock generator circuits may be load matched with respect to the others to minimize the skew between clock signals, and each receives a synchronized timing signal provided from a master timing distribution circuit. As a result of the distributed clock generation scheme, the amount of current and the rate at which current is sourced or sunk at a given location on the semiconductor die is reduced, thereby reducing electromagnetic interference and increasing the signal to noise ratio. In addition, the loading upon the distributed clock generators due to the internal routing of the clock signals is decreased, also reducing electromagnetic interference and power consumption.

13 Claims, 8 Drawing Sheets

MICROPROCESSOR WITH DISTRIBUTED CLOCK GENERATORS

BACKGROUND OF THE INVENTION

1. Field of the Invention

This invention relates to microprocessor circuitry and, more particularly, to the generation of internal microprocessor clock signals.

2. Description of the Relevant Art

Microprocessor circuits require clock signals to provide timing references for controlling activities within the microprocessor. A microprocessor typically receives an external clock signal generated by a crystal oscillator or other external clock source and, using this external clock signal, generates an internal clock signal having a high degree of stability with a fifty-percent duty cycle. The internally generated clock signal may have the same frequency as that of the external clock signal or may have a frequency that is a fraction or a multiple of the external clock signal frequency.

CMOS integrated circuit microprocessors, for proper operation thereof, generally must be clocked by an internal clock signal having a first phase and a second phase for each clock cycle period. The clock signal first phase is at a high level for a first execution time period and the second phase is at a low level for a second execution time period to complete each clock cycle. The reason for this clocking procedure is that CMOS integrated circuits include circuitry wherein a first portion of the circuitry is active during the high level first phase of the clock signal and the other portion of the circuitry is active during the low level second phase of the clock signal. For this reason, the microprocessor typically generates a pair of internal clock signals that are 180 degrees out of phase, one being provided to the first portion of the circuitry and the second being provided to the other portion of the circuitry.

The first and second phases of each clock signal cycle must be of sufficient duration to enable both portions of the microprocessor circuitry to complete their execution. Each such portion requires some finite minimum execution time because of internal microprocessor delays resulting from internal speed paths. To ensure that the minimum execution times are met for both portions of the microprocessor circuitry while maximizing the frequency of the internal clock signals, the duty cycles of the internal clock signals are typically regulated and maintained at fifty percent.

In addition to the foregoing, the internal speed paths and resulting first and second minimum execution time periods are greatly affected by integrated circuit processing parameters, microprocessor operating temperature, and microprocessor operating supply voltage. For example, microprocessors execute more slowly as operating temperature increases. Microprocessors also execute more slowly as the operating supply voltage decreases. In either or both of these cases, the duration of the first and second clock signal phases must be extended to provide first and second execution times which are sufficient to accommodate the increased first and second minimum execution time periods.

Clock generators for providing such clock signals are generally provided "on chip" in CMOS microprocessor devices. However, as stated previously, they develop the clock signal or signals in response to an input clock signal generated by an external clock source. The on chip clock generator must be arranged to provide the clock signal first and second phases because external clock sources cannot always be relied upon to provide the clock signals accurately. In fact, external clock sources usually provide input clock signals having a duty cycle in a wide range. It is therefore required that the on chip clock generator be able to derive the clock signals for clocking the microprocessor responsive to an input clock signal having a wide range of duty cycles.

In addition to providing internal clock signals that are 180 degrees out of phase with duty cycles of fifty percent, there are several other important considerations associated with the generation of such clock signals. On the semiconductor die itself, a single on chip clock generator is typically situated near the center of the microprocessor chip. The drive strength requirements of this internal clock generator depends upon the type and amount of other circuitry fabricated on the microprocessor die, as well as the routing of the clock signals. In general, as the circuitry incorporated on the microprocessor die becomes more complex and voluminous, the greater the required drive strength of the internal clock generator. This can adversely affect electromagnetic interference (EMI).

Electromagnetic interference is generated by nearly all electrical circuits. The quantity of EMI radiated by a microprocessor circuit is based upon many factors, including the current transitions generated by the clocks and other logic circuits driven by the clocks. In general, the circuits on the semiconductor chip are a source of the transient currents, and the surrounding components such as the device package, the printed circuit board, and the cables attached to the printed circuit board act as antennae that radiate the high frequency components of the transient currents.

EMI can radiate in one of two modes: common mode and differential mode. Differential mode radiation occurs when time-varying current loops exist on a PC board or similar structure. Common mode radiation is basically a uniform flow of current through, for example, a monopole antenna.

Current loops of high frequency current are set up in the vicinity of microprocessors due to on-chip clock circuits. This is because the current drive source for the clock drivers are often localized while the return path for the current (through the load on the clock signals, which is a distributed capacitance) is more uniformly distributed. The current drive source is not generally uniform because the clock drivers are sometimes on isolated power supplies on the chip, because the clock driver is closer to one side of the chip, or because of some other asymmetry in the power supply pins to the microprocessor.

The transient currents and therefore the EMI generated by the internal clock generator of a microprocessor can be excessively large for a number of reasons. First, as the circuit complexity of microprocessors has grown during the past years, so have the drive requirements of the internal clock generator. The driver transistors within the internal clock generator have therefore been required to source and sink increasingly larger current levels. This has led to significant increases in the generated EMI due to the large current that is sourced or sunk at a given location on the semiconductor die.

Another reason electromagnetic interference can become excessive is that the internal clock generator is designed to satisfy the drive requirements during worst-case conditions. As a consequence, the clock generator is significantly over-driven during normal operating conditions, thus resulting in increased electromagnetic interference.

Chip manufacturers typically control EMI emissions through package design techniques. These techniques include power/ground planes within the package, grounded seal lids, and rails for by-pass capacitors. Systems manufacturers typically use board-level and enclosure techniques including moating in the PC board, separate power-ground planes, chokes, decoupling capacitors, and shielding. Many of these techniques are relatively expensive to employ.

EMI reduction is a rather important feature for manufacturers who would like to comply with FCC Class B and other requirements. Compliance with FCC Class B allows the device to be used in either a residential or a commercial application. Class A is restricted to industrial use only. Thus, a product that conforms to Class B will include a much larger market.

The internal clock frequency is also an important consideration with respect to the generation of internal microprocessor clock signals. In general, as the speed of the internal microprocessor clock increases, the time required to execute a particular program decreases. Thus, microprocessors having relatively high internal clock frequencies are desirable for high performance and computational-intensive applications. On the other hand, relatively fast microprocessors are usually more expensive than slower microprocessors, both in design and manufacture. Furthermore, a microprocessor operating at higher speeds typically consumes more power in comparison to their lower speed counterparts. The frequency and edge rate (slew rate) of the internal clock signals also affect the EMI emissions significantly.

As a result of these tradeoffs of generated EMI, performance, and cost, microprocessor manufacturers commonly provide versions of the same microprocessor family that meet different EMI, power and speed targets; one version that operates at a relatively high speed for high performance and computational-intensive applications, and another version that operates at a lower speed for low EMI and low power applications. To provide these differing versions, the microprocessor is typically fabricated with two separate clock generators incorporated on the semiconductor die. Mask programming methods can be employed during the fabrication of the microprocessor to enable one of the clock generators and disable the other clock generator. Unfortunately, this technique is somewhat expensive since a different set of masks must be used for the different microprocessor versions and, in addition, considerable die space is wasted since one of the clock generators on the semiconductor die is permanently disabled. Furthermore, once the microprocessor chip has been fabricated for use with a crystal oscillator of a predetermined maximum frequency, the internal maximum clock frequency cannot be changed.

SUMMARY OF THE INVENTION

In accordance with the present invention, a distributed clock generation scheme is provided for a microprocessor that reduces electromagnetic interference and power consumption. Rather than using a single, large internal clock generator circuit that meets the drive requirements of the remaining circuitry upon the microprocessor die, one embodiment of the invention provides for a plurality of smaller clock generator circuits distributed across the die, each generating clock signals to drive a separate portion of the microprocessor circuitry. Each of the distributed clock generator circuits may be load matched with respect to the others to minimize the skew between clock signals, and each receives a synchronized timing signal provided from a master timing distribution circuit. As a result of the distributed clock generation scheme, the amount of current and the rate at which current is sourced or sunk at a given location on the semiconductor die is reduced, thereby reducing electromagnetic interference and increasing the signal to noise ratio. In addition, the loading upon the distributed clock generators due to the internal routing of the clock signals is decreased, also reducing electromagnetic interference and power consumption.

These and other advantages are achieved with the present invention, in accordance with which a microprocessor circuit fabricated on a semiconductor die comprises a means for receiving an external clock signal, a first circuit area including circuitry driven by a first clock signal, a second circuit area including circuitry driven by a second clock signal, and a third circuit area including circuitry driven by a third clock signal. A first distributed clock generator circuit is fabricated at a first location on the semiconductor die and provides the first clock signal to the first circuit area. Similarly, a second distributed clock generator circuit is fabricated at a second location on the semiconductor die and provides the second clock signal to the second circuit area, and a third distributed clock generator circuit is fabricated at a third location on the semiconductor die and provides the third clock signal to the third circuit area. Each of the first, second, and third distributed clock generator circuits receives a master timing signal derived from the external clock signal.

The invention will be more readily understood with reference to the drawings and the detailed description. As will be appreciated by one skilled in the art, the invention is applicable to microprocessors in general and is not limited to the specific embodiment disclosed.

DETAILED DESCRIPTION

The following includes a detailed description of the best presently contemplated mode for carrying out the invention. The description is intended to be merely illustrative of the invention and should not be taken in a limiting sense.

Figure 1:
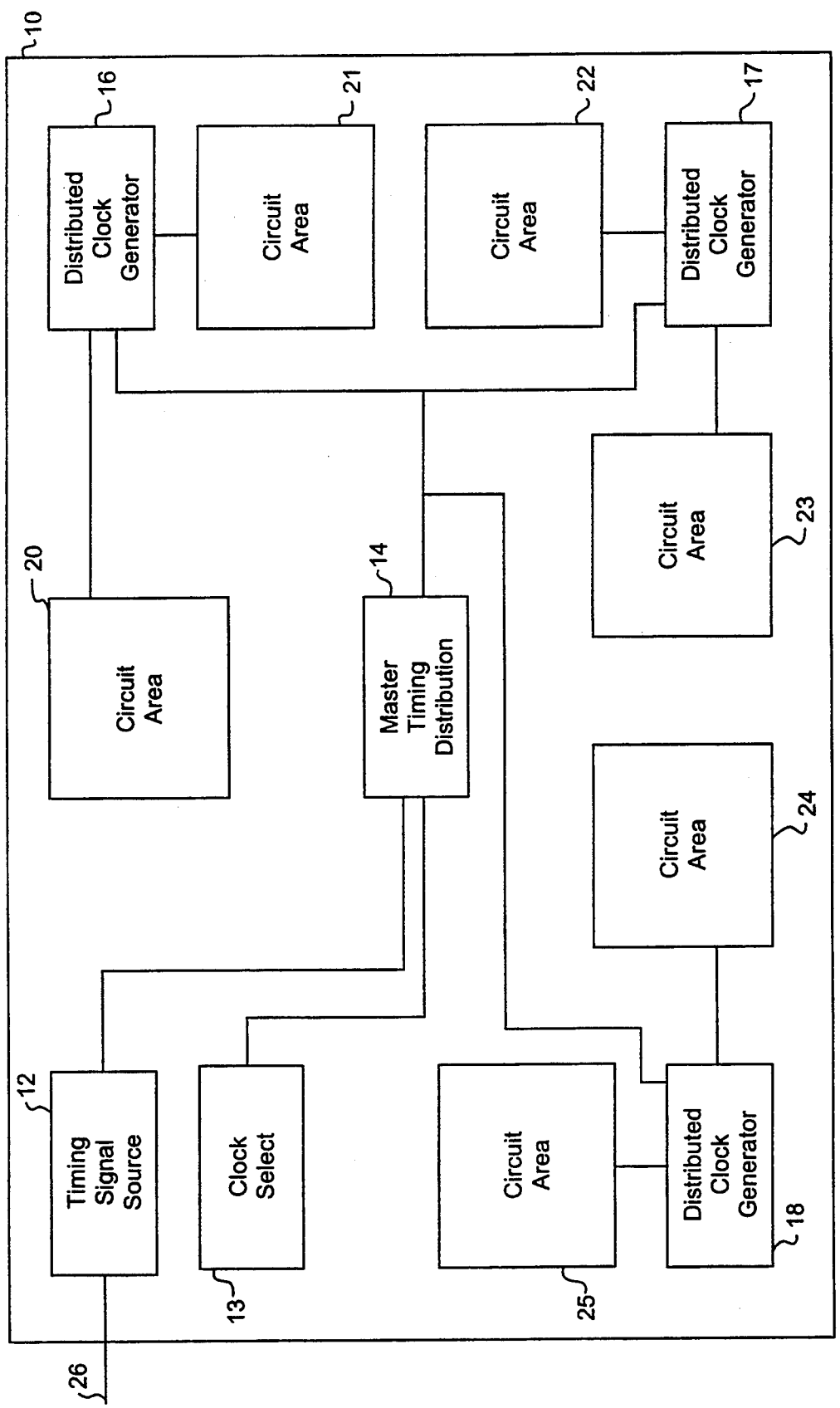
FIG. 1 is a block diagram of a microprocessor circuit die including distributed clock generators.

Referring to FIG. 1, a block diagram is shown of a microprocessor circuit 10 including a distributed clock generation scheme. The microprocessor circuit 10 includes a timing signal source 12, a clock select circuit 13, a master timing distribution circuit 14, and a plurality of distributed clock generator circuits 16–18. Each of the distributed clock generator circuits 16–18 provide clocking signals to separate circuit areas of the microprocessor represented by blocks 20–25. The circuit areas illustrated by blocks 20–25 are representative of circuitry within various subsections of the microprocessor, such as the program counter, internal registers, arithmetic logic unit (ALU), internal cache, multipliers, and adders. In this embodiment, the distributed clock generator circuit 16 provides clocking signals to circuit area 20 and to circuit area 21. Similarly, clock generator circuit 17 provides clocking signals to circuit areas 22 and 23, and distributed clock generator circuit 18 provides clocking signals to circuit areas 24 and 25.

An external clock signal is received by microprocessor circuit 10 at an external clock input line 26 and is coupled to the timing signal source 12. The external clock signal may be provided from a crystal oscillator or other clock source. As will be appreciated from the description below, the timing signal source 12 provides a pair of timing signals to the master timing distribution circuit 14, a first of which having a frequency equal to that of the external clock signal, and the other of which having a frequency half that of the external clock signal. The timing signal source 12 includes divide-by-two circuitry as well as duty cycle control circuitry to ensure that both timing signals are maintained with duty cycles of fifty percent.

The clock select circuit 13 is also coupled to master timing distribution circuit 14 and is provided to accommodate a clock speed switching function that allows the microprocessor 10 to operate at a variety of user selectable frequencies. The clock speed may be designated via software programming and may be changed during the execution of a program. It will also be appreciated that the drive strength of each of the distributed clock generator circuits 16–18 is variable based upon the selected frequency of operation. Details of this clock speed select function as well as other features of the clock select circuit 13 will be described in greater detail below.

The master timing distribution circuit 14 receives the pair of timing signals from the timing signal source 12 and, depending upon a clock select signal provided from clock select circuit 13, provides a master timing signal of a designated frequency to each of the distributed clock generator circuits 16–18. Each of the distributed clock generator circuits 16–18 correspondingly generates a pair of clock signals that are 180 degrees out of phase with respect to one another to drive the associated circuit areas 20–25. Details of this circuitry will also be described further below.

It is noted that circuit areas 20–25 are defined by design such that each of the distributed clock generator circuits 16–18 is loaded approximately equally with respect to the others. Furthermore, the lines that connect the master timing distribution circuit 14 to the distributed clock generator circuits 16–18 are configured to have approximately equal lengths. These characteristics result in reducing the skew between the clock signals generated by each of the distributed clock generators 16–18.

It is also noted that since a plurality of distributed clock generator circuits 16–18 are distributed at various locations on the microprocessor die, each driving a separate circuit area 20–25, the amount of current that is sourced or sunk at a given location on the semiconductor die as a result of the clock generator circuits is less in comparison to that which would be sourced or sunk at a given location by a single clock generator circuit provided to drive the entire microprocessor circuit. Similarly, since the distributed clock generators 16–18 can be positioned relatively close to the respective circuit areas 20–25, the average length of the routing lines that couple the clock signals to the circuit areas is reduced. Thus, the load upon the clock generators is also reduced. As a result, power consumption and electromagnetic interference is reduced and signal to noise ratio is maximized.

Furthermore, since the clock generators are distributed, the current to the clock generators is more uniformly distributed among the various power supply pins of the processor. This allows the designer to supply the clock generators with supplies that are common with (not isolated from) the other chip power supplies and helps to make the clock drive source currents even more uniformly distributed. When power supply currents are more uniformly distributed, differential mode currents are less likely to occur.

Figure 2:
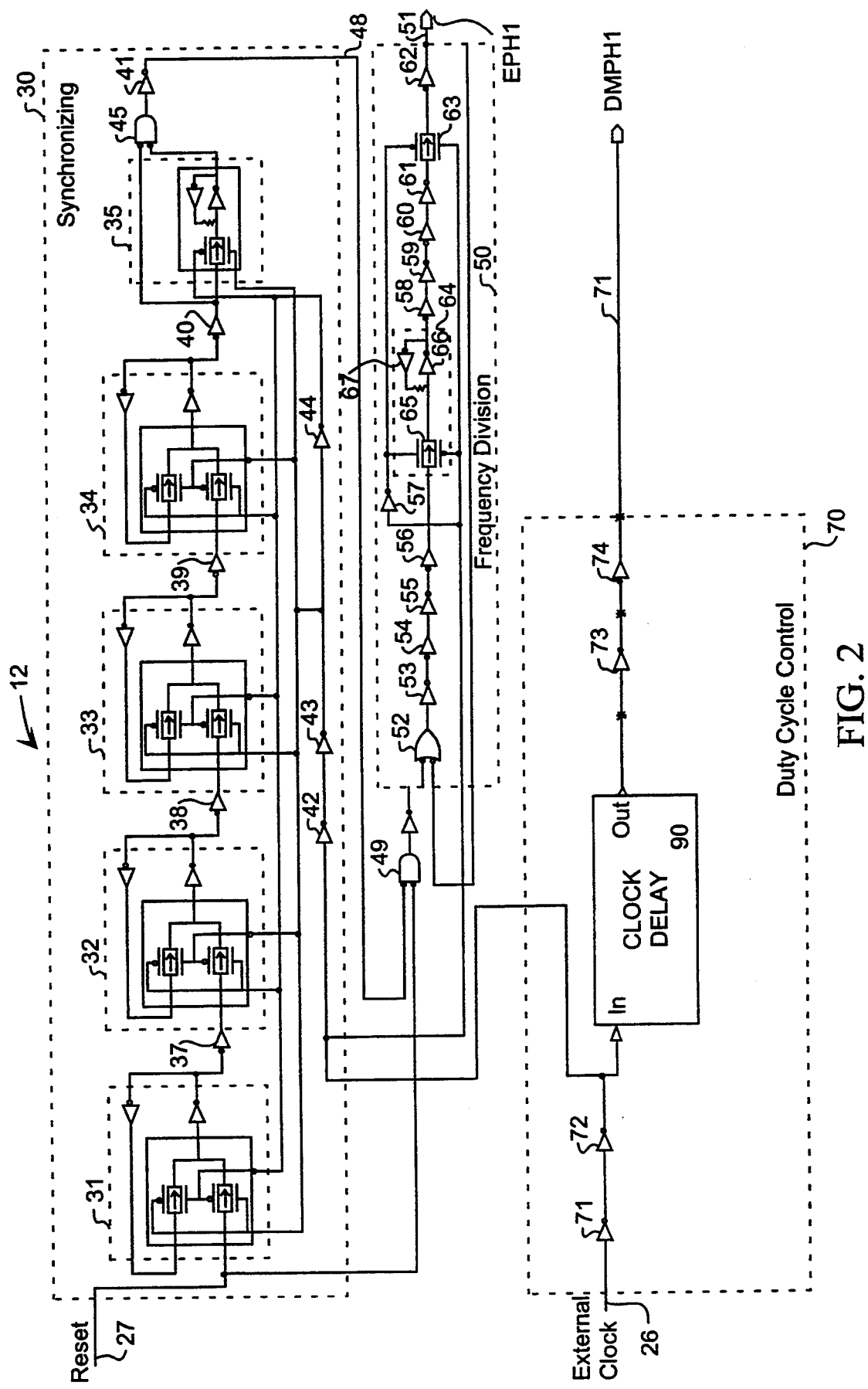
FIG. 2 is a schematic diagram of a timing signal source.

Exemplary circuitry implementing each of the blocks of FIG. 1 will next be considered with reference to FIGS. 2–6. Referring first to FIG. 2, a schematic diagram is shown of a timing signal source 12. The circuit includes a synchronizing circuit 30, a frequency division circuit 50, and a duty cycle control circuit 70. An external clock signal is received at line 26 and is coupled to the synchronizing circuit 30, the frequency division circuit 50, and the duty cycle control circuit 70. A reset signal is received at a line 27 and is coupled to the synchronizing circuit 30 and the frequency division circuit 50. A line 51 is coupled to an output of the frequency division circuit 50 to provide a first timing signal labelled EPH1 having a frequency that is half the frequency of the external clock signal applied at line 26. Another line 71 is provided at an output of the duty cycle control circuit 70 to provide a second timing signal labelled DMPH1 having the same frequency as the external clock signal. Both the first and the second timing signals EPH1 and DMPH1 provided from lines 51 and 71, respectively, have a fifty percent duty cycle despite the possibility of duty cycle variations in the external clock signal at line 26.

The synchronizing circuit 30 is provided to synchronize the falling edge of the reset signal with the rising edges of the first timing signal EPH1 at line 51. The synchronizing circuit 30 includes latches 31–35, inverters 37–44, and a NOR gate 45. Each of the latches 31–34 is implemented with a pair of CMOS transfer gates, a forward inverter, and a feedback inverter. The latch 35 is implemented with a CMOS transfer gate, a forward inverter, and a resistive feedback inverter.

When the reset signal at line 27 is high, the microprocessor system is in a reset mode. Upon the falling edge of the reset signal, the rising edge of the first clock signal provided at line 51 must be synchronized thereto. As will be appreciated by those skilled in the art, four clock cycles after the falling edge of the reset signal occurs, a low pulse is generated at an output line 48 of the synchronizing circuit 30 and is provided to an input of NOR gate 49. This pulse remains low for the entire duration during which the external clock pulse is low. The synchronizing circuit 30 is a typical synchronization circuit and such are known to those skilled in the art.

The frequency division circuit 50 is similarly known to those skilled in the art and includes a nand gate 52, inverters 53–62, a CMOS transfer gate 63, and a latch 64 implemented using a transfer gate 65, a forward inverter 66, and a resistant feedback inverter 67. The frequency division circuit 50 provides the first timing signal EPH1 at line 51 having a frequency that is half the frequency of the external clock signal provided at line 26. Those skilled in the art will appreciate that the first timing signal EPH1 at line 51 is phase shifted when both the reset signal goes low and the pulse signal provided from the synchronizing circuit 30 at line 48 goes low such that the first timing signal EPH1 becomes synchronized with the falling edge of the reset signal.

The duty cycle control circuit 70 includes inverters 71–74 and a clock delay circuit 90. The duty cycle control circuit 90 receives the incoming external clock signal at line 26 and provides the second timing signal DMPH1 at line 71. As will be better understood from the following description of the clock delay circuit 90, the second timing signal DMPH1 has the same frequency as the external clock signal received at line 26 and a duty cycle of fifty percent.

Figure 3:
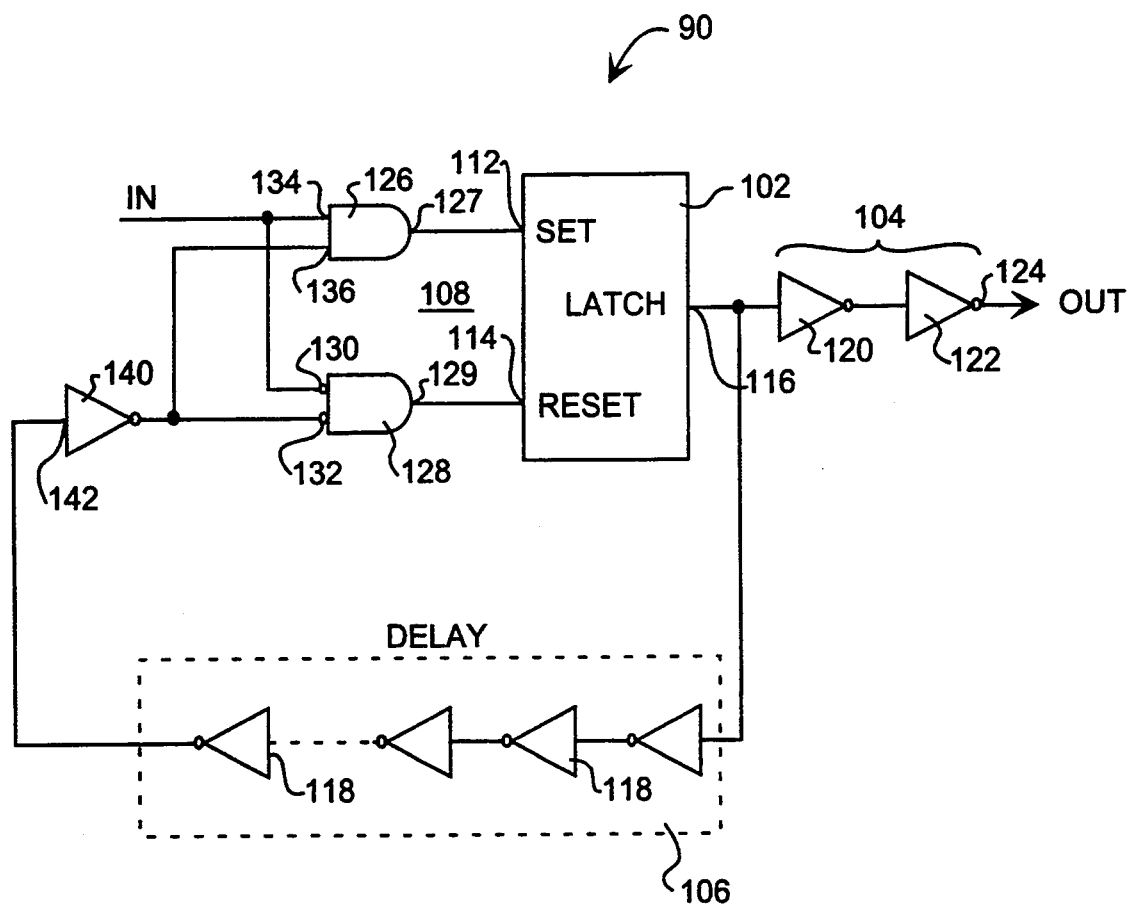
FIG. 3 is a schematic diagram of a clock delay circuit.

Referring now to FIG. 3, the clock delay circuit 90 generally includes a latch 102, a buffering means 104, a delay means 106, and an input conditioning means 108. The latch 102 includes a set input 112, a reset input 114, and an output 116. When the set input 112 is high and the reset input 114 is low, the latch 102 is set so that the output 116 is at a high level. Conversely, when the set input 112 is low and the reset input 114 is high, the latch is reset so that the output 116 is low. Such latches are well known in the art.

The delay means 106 comprises a plurality of serially coupled inverters 118. Each inverter corresponds to a delay proportional to an average gate delay of the integrated circuit in which the clock delay circuit 90 is employed. The delay means 106 is coupled between the output 116 of latch 102 and the reset input 114 of the latch through the input conditioning means 108. The buffering means 104 comprises a pair of inverters 120 and 122 which provide at the output 124 of inverter 122 a timing signal to be applied to the master timing distribution circuit 14. The delay means serves to delay the application of the output timing signal at output 116 of latch 102 to the reset input 114 of the latch 102. To provide an output timing signal with a duty cycle of fifty percent, the delay of delay means 106 is chosen to be one half the period of the input signal.

The input conditioning means 108 comprises an AND gate 126 and a NOR gate 128. As will be noted in FIG. 3, the first input 130 of NOR gate 128 is coupled to the first input 134 of AND gate 126. The second input 132 of NOR gate 128 is coupled to the second input 136 of AND gate 126. The first input 134 of AND gate 126 and the first input 130 of NOR gate 128 are coupled to receive the external clock signal having a duty cycle within a wide range of duty cycles from which the output timing signal is derived. The delay means 106 is coupled to the second input 136 of AND gate 126 and the second input 132 of NOR gate 128 through inverter 140. To that end, inverter 140 has an input 142 coupled to the delay means 106.

As previously mentioned, the microprocessor to be clocked by the internal clock signal includes a first circuit portion which is active during a first phase of the internal clock signal when the internal clock signal is at a high level and a second circuit portion which is active during a second phase of the internal clock signal when the internal clock signal is at a low level. Each circuit portion includes a speed path formed by internal gate delays which result in minimum first and second execution times during the first and second phases to enable each circuit portion to complete its execution during its respective internal clock signal phase.

The external clock signal sets and resets the latch 102 to cause the latch 102 to provide the second timing signal DMPH1. However, the external clock signal only sets and resets the latch 102 when the latch is set or reset enabled by the output of the delay means 106. Hence, the number of inverters 118 selected for delay means 106 should represent a delay time at least equal to the greater of the first and second minimum execution times. By so doing, each phase of the second timing signal DMPH1 will be assumed to provide a sufficient execution time to accommodate the speed paths of both circuit portions.

Hence, the delay time of the delay means 106 assumes a minimum execution time for each phase of the internal clock signal. The actual duration of each phase may be longer than the minimum execution times required by the processor because the external clock signal may define first or second phases which are longer than the delay time of the delay means 106. If one of the phases defined by the external clock signal is longer than the delay time, the delay means 106 will have no effect because it would have already enabled the latch 102 to be set or reset by the time the external clock signal changes to the next phase.

It will also be appreciated that the clock delay circuit 90 is also self-regulating. The self-regulation comes into play because the delay means is arranged to vary its delay time in direct relation to the delay time represented by the microprocessor speed paths. This results because the delay means 106 includes a plurality of serially coupled inverters with each inverter representing a delay proportional to an average gate delay of the microprocessor. Hence, the same parameters such as processing parameters, temperature, and supply voltage magnitude, for example, which vary the delay time of the speed paths will have the same effect on the delay time of the delay means 106.

In operation, when the external clock signal is high and the input 142 of inverter 140 is low, the set input 112 of latch 102 is correspondingly high to set latch 102 and cause the output 116 to be high. When the external clock signal is at a low level and the input 142 of inverter 140 is high, the set input 112 of latch 102 is correspondingly low and the reset input 114 of latch 102 is correspondingly high to reset latch 102 and cause the output 116 of latch 102 to be low.

From the foregoing description of the timing signal source 12, it is evident that a first timing signal EPH1 having a frequency half that of the external clock signal and a second timing signal DMPH1 having the same frequency as the external clock signal are provided to the master timing distribution circuit 14. Signals EPH1 and DMPH1 are each duty-cycle regulated and phase-synchronized with the reset signal.

Figure 4:
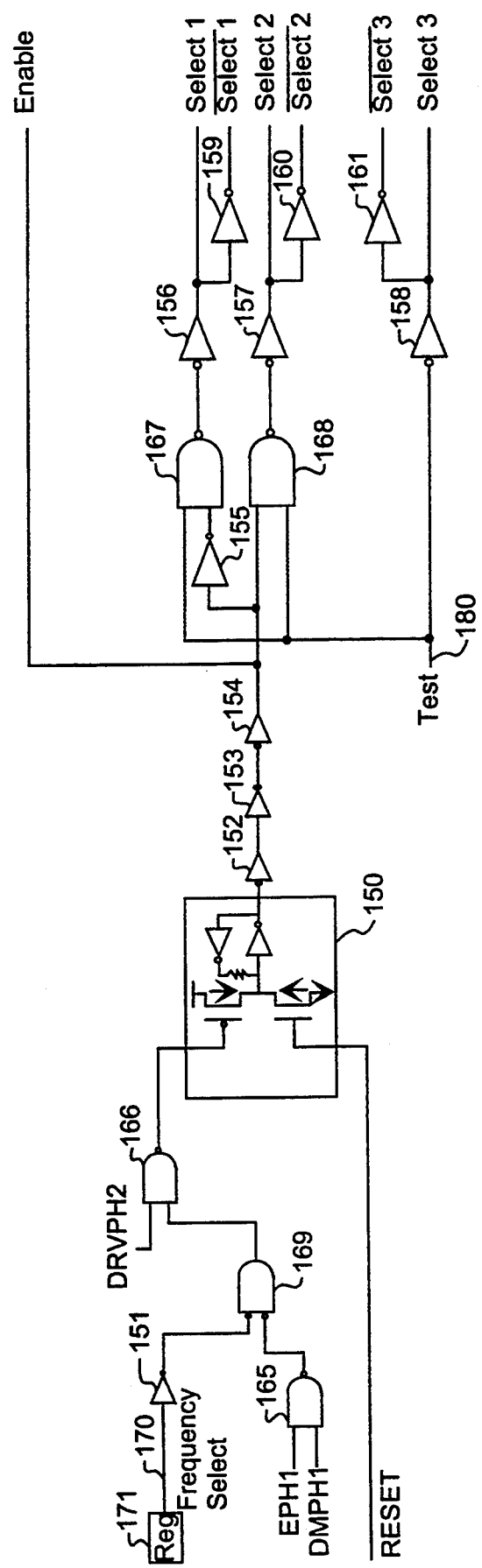
FIG. 4 is a schematic diagram of a clock select circuit.

Referring next to FIG. 4, the clock select circuit 13 is next considered. The clock select circuit 13 is provided to allow the programmer or user of the microprocessor to select either the first internal timing signal EPH1 or the second internal timing signal DMPH1 to control the internal activities of the microprocessor. Alternatively, an external third timing signal may be selected to derive the internal clock signal. The circuit includes a latch 150, inverters 151–161, nand gates 165–168, and a NOR gate 169.

When the microprocessor circuit is initially turned on, the frequency select signal at line 170 is initially low. The frequency select signal at line 170 is sourced from an internal register 171 of the microprocessor that allows software programming of the internal clock speed. When the frequency select signal is low, the output of nand gate 166 is high regardless of signals EPH1, DMPH1, and DRVPH2. As will become evident from the diagrams of the distributed clock generator circuits, signal DRVPH2 is an output clock signal used to drive the respective circuit areas 20–25. Since the output of nand gate 166 is high, the output of inverter 154 goes low. If the test signal at line 180 is high, the output of nand gate 167 is low and the output of nand gate 168 is high. Consequently, signal select1 goes high and signal select1 goes low. Similarly, signal select2 goes low and signal select2 goes high. Furthermore, signal select3 goes low and signal select3 goes high. As will be appreciated from the description below of the master timing distribution circuit 14, these signals cause the master timing distribution circuit 14 to select the first timing signal EPH1 from the timing signal source 12 for distribution to each of the distributed clock generator circuits 16–18. Each of the distributed clock generator circuits 16–18 will responsively generate a pair of clock signals (DRVPH1 and DRVPH2) that are 180 degrees out of phase to be provided to the respective circuit areas 20–25.

The microprocessor speed can be changed by setting the internal register 171 high. When this register location is set, the output of NOR gate 169 will go high upon the rising edges of signals EPH1 and DMPH1. The output of nand gate 166 will go low following this if signal DRVPH2 is also high. When the output of nand gate 166 goes low, the latch 150 is set, and the output of inverter 156 goes low and the output of inverter 157 goes high. This correspondingly causes the master clock distribution circuit 14 to select the second internal clock signal DMPH1 having a frequency twice that of the first clock signal EPH1.

As will be appreciated from the following, the test signal at line 180 may be asserted low to override the circuit such that neither the first nor the second timing signals EPH1 and DMPH1 are selected. Instead, a pair of test signals (TestPH1 and TestPH2) may be provided to the master timing distribution circuit for testing purposes.

It is noted that latch 150 of the clock select circuit 13 is configured such that the internal clocking of the microprocessor may be controlled by the first timing signal EPH1 and subsequently changed to the second timing signal DMPH1 having twice the frequency. Once the second timing signal DMPH1 is selected, the microprocessor system must be reset to return to operation at the lower frequency of the first timing signal EPH1. It is also noted that the internal clocking can switch from the frequency of the first timing signal EPH1 to the frequency of the second timing signal DMPH1 only when both clock signals are high, and in addition, only when the clock output signal DRVPH2 provided from the distributed clock generator circuits 16–18 is also high. These conditions ensure that proper timing is maintained and prevents the generation of signal glitches.

Additionally, when the first timing signal EPH1 is selected, the enable signal is low. When the second timing signal DMPH1 having a frequency twice that of the first timing signal is selected, the enable signal is set high. As will be appreciated from the following, the enable signal is used to control each the distributed clock generator circuits such that increased drive is provided for the internal clock signals when operating at the higher frequency.

Figure 5:
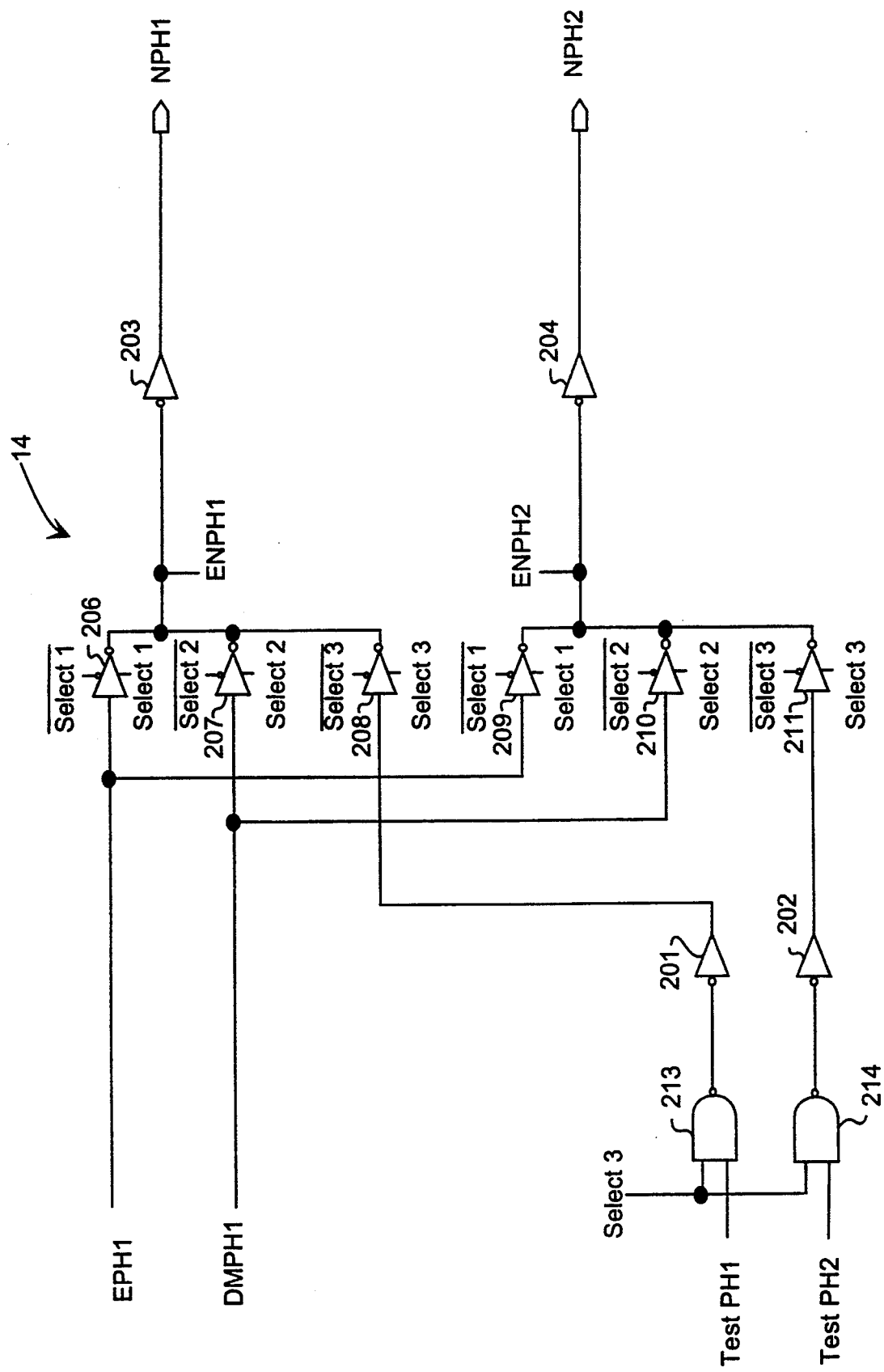
FIG. 5 is a schematic diagram of a master timing distribution circuit.

Referring next to FIG. 5, a schematic diagram is shown of a master timing distribution circuit 14. The master timing distribution circuit includes inverters 201–204, inverting buffers 206–211, and nand gates 213 and 214. The master timing distribution circuit is a signal switching circuit that receives signals EPH1 and DMPH1 from the timing signal source 12, and provides output timing signals NPH1 and NPH2 at lines 215 and 216 that have a frequency corresponding to either signal EPH1 or signal DMPH1 depending upon the clock select signals. Alternatively, a pair of test signals TestPH1 and TestPH2 are switched to the output lines of the master timing distribution circuit 14 when signal select3 is asserted. These test signals may be controlled during test operations of the microprocessor.

Figure 6:
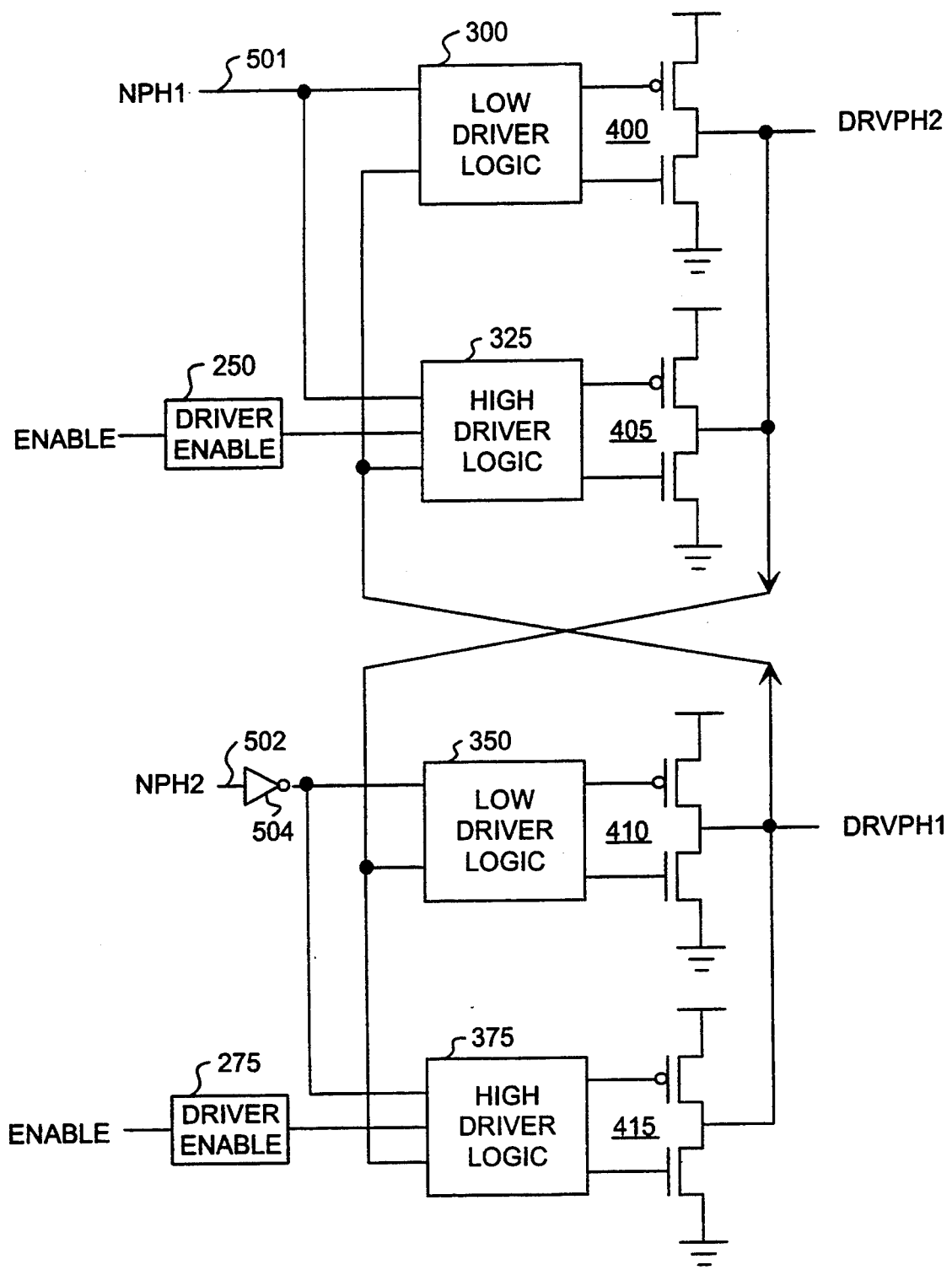
FIG. 6 is a block diagram of a distributed clock generator circuit.

The distributed clock generator circuits 16–18 are next considered with reference to the block diagram of FIG. 6. The circuit of FIG. 6 is representative of each of the distributed clock generator circuits 16–18, and includes driver enable circuits 250 and 275, low driver logic blocks 300 and 350, high driver logic blocks 325 and 375, and driver output transistor stages 400, 405, 410 and 415. Each of the driver output transistor stages includes a P-channel field effect transistor and an N-channel field effect transistor. Timing signal NPH1 from the master timing distribution circuit 14 is received at a line 501 and is provided to the low driver logic 300 and the high driver logic 325. Clock signal NPH2 from the master clock distribution circuit 14 is similarly received at a line 502, inverted by inverter 504, and provided to the low driver logic 350 and the high driver logic 375. Signals DRVPH1 and DRVPH2 are derived from these signals and are used as the internal clock signals capable of driving other circuitry on the microprocessor. Signals DRVPH1 and DRVPH2 are 180 degrees out of phase as a result of the feedback loop in the clock generator circuit. The enable signal is also received from clock select 13 at driver enable blocks 250 and 275, which correspondingly control high driver logic blocks 325 and 375. When the enable signal is high, driver enable blocks 250 and 275 enable high driver logic blocks 325 and 375 such that the driver output transistor stages 405 and 415 are enabled in an operative mode. When the enable signal is low, driver enable blocks 250 and 275 disable the high driver logic blocks 325 and 375 such that the driver transistor output stages 405 and 415 are disabled in an inoperative mode. As a result, during low frequency operation of the microprocessor when the first timing signal EPH1 is selected, the output stages 405 and 415 are disabled, thus reducing electromagnetic interference. When operating in a high frequency mode when timing signal DMPH1 is selected, more drive is necessary. Consequently, output stages 405 and 415 are enabled, thus providing sufficient drive to drive the respective circuit areas 20–25.

Figure 7:
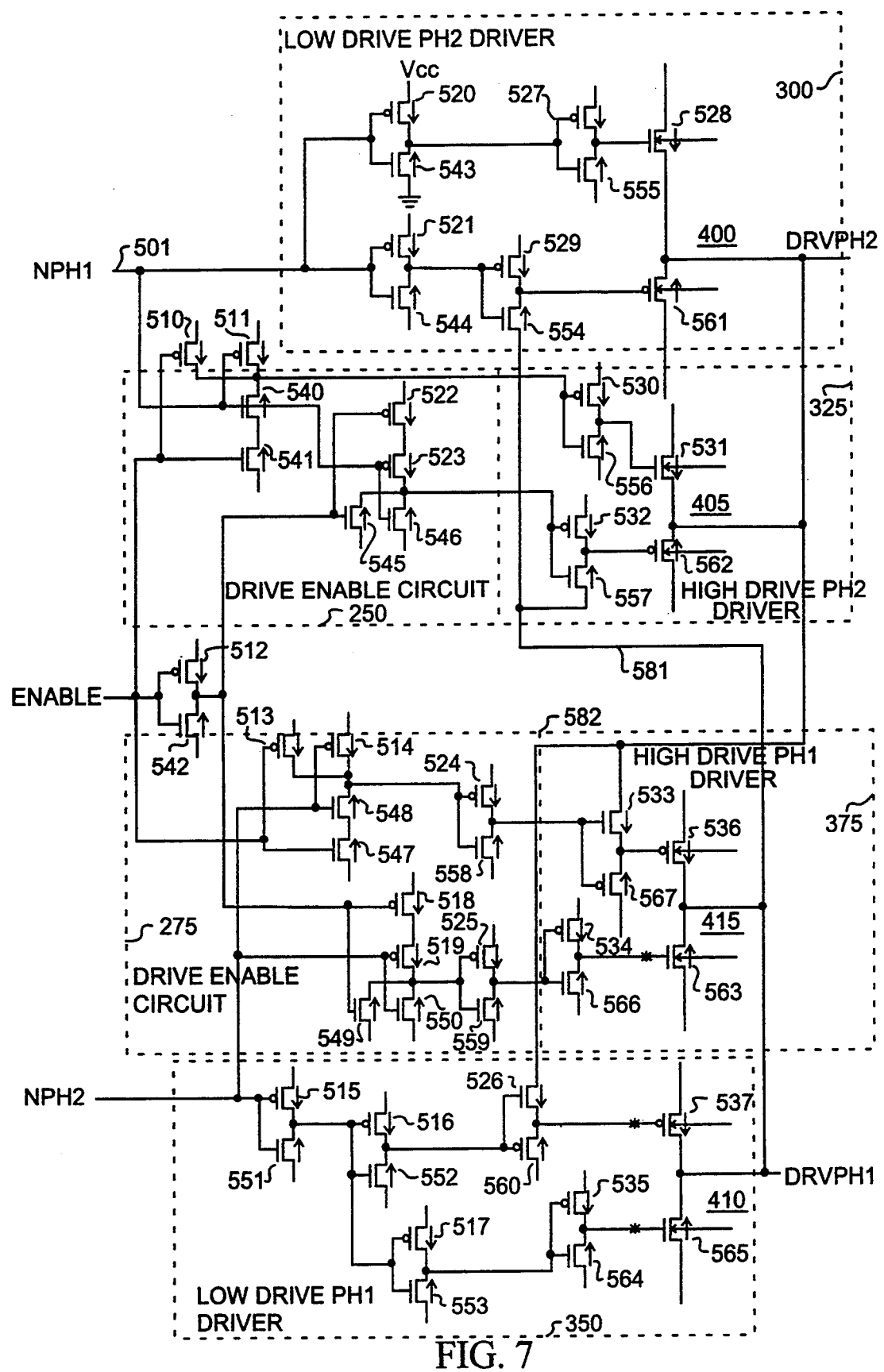
FIG. 7 is a schematic diagram of a distributed clock generator circuit.

FIG. 7 is a schematic diagram illustrating a distributed clock generator circuit. Circuit elements corresponding to those of FIG. 6 are numbered identically. The circuit includes a plurality of P-channel field effect transistors 510–537 and a plurality N-channel field effect transistors 540–567. A voltage $V_{cc}$ is applied to the unconnected terminal of each P-channel transistor, while each unconnected terminal of the N-channel transistors is connect to ground. When the enable signal is low, the drive enable circuit 275 disables the high driver circuit 375 and the drive enable circuit 250 disables the high driver 325. For example, to disable the high driver circuit 375, transistor 513 turns on, thus driving the output of an inverter formed by transistors 524 and 558 low. This consequently drives the output of an inverter formed by transistors 533 and 567 high. Output transistor 536 is thereby held in an inoperative state. Similarly, since transistor 549 is turned on, the output of an inverter formed by transistors 525 and 559 is high. Consequently, the output of an inverter formed by transistors 534 and 566 is low. Output transistor 563 is therefore also held in an inoperative state.

On the other hand, it is evident that the low driver circuits 300 and 350 are always enabled such that their respective input timing signals NPH1 and NPH2 control the state of the output clock signals DRVPH1 and DRVPH2. It is appreciated that when, for example, timing signal NPH2 is low, the output of an inverter formed by transistors 515 and 551 is high. The outputs of an inverter formed by transistors 516 and 552 and an inverter formed by transistors 517 and 553 are therefore low. The output clock signal DRVPH1 is consequently low. Similarly, when timing signal NPH2 goes high, clock signal DRVPH1 also goes high.

The clock output signals DRVPH1 and DRVPH2 are 180 degrees out of phase with respect to one another and are provided to the respective circuit areas 20-25. It is noted that a feedback line 581 and a feedback line 582 are provided to ensure that clock signals DRVPH1 and DRVPH2 are 180 degrees out of phase. For example, feedback line 581 ensures that clock signal DRVPH2 cannot go high until clock signal DRVPH1 has reached a threshold low voltage level.

Figure 8:
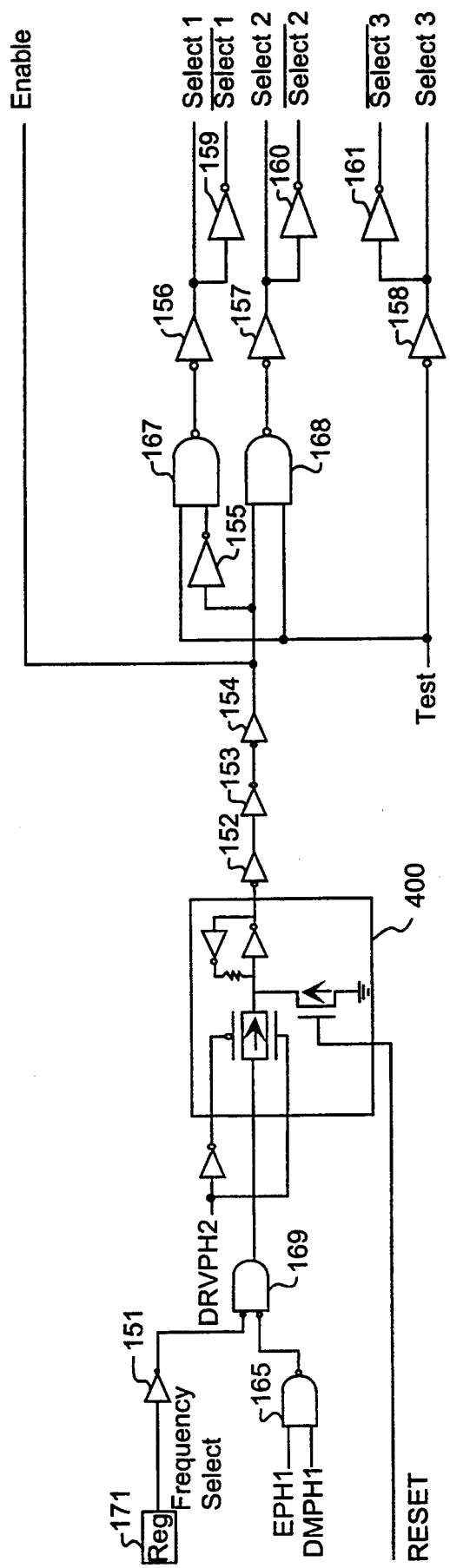
FIG. 8 is a schematic diagram of a second embodiment of a clock select circuit.

Referring finally to FIG. 8, a second embodiment of the clock select 13 is shown that is similar to that of FIG. 4. In this embodiment however, a different latch circuit 400 is employed that allows the circuit to switch back and forth between the first timing signal EPH1 and the second timing signal DMPH1 without asserting the reset signal. As such, not only can the user switch from the lower frequency of signal EPH1 to the higher frequency of signal DMPH1 during program execution, the frequency can also be changed from that of the high frequency of signal DMPH1 to the lower frequency of signal EPH1 without resetting the microprocessor circuit.

Numerous modifications and variations will become apparent to those skilled in the art once the above disclosure is fully appreciated. It is to be understood that the above detailed description of the preferred embodiment is intended to be merely illustrative of the spirit and scope of the invention and should not be taken in a limiting sense. The scope of the claimed invention is better defined with reference to the following claims.

What is claimed is:

1. A microprocessor circuit fabricated on a semiconductor die comprising:
    plurality of distributed circuit segments having substantially equal drive strength requirements, each segment further comprising:
        a circuit area including circuitry driven by a clock signal, and
        a distributed clock generator circuit fabricated at a distributed location on the semiconductor die and coupled to the circuitry within the circuit area to supply the clock signal thereto;
    a master timing distribution circuit coupled to the distributed clock generator circuits for supplying a master timing signal having a selectively variable frequency to each distributed clock generator circuit;
    means for supplying a drive control signal to each distributed clock generator circuit of the plurality of distributed circuit segments for setting the drive strength of each distributed clock generator circuit; and
    a timing signal source having an output coupled to the master timing distribution circuit and an input for receiving an external clock signal, wherein the timing signal source includes a frequency division circuit coupled to the master timing distribution circuit, and wherein said frequency division circuit generates a first timing signal having a frequency substantially half that of the external clock signal and a second timing signal having a frequency substantially equal to the external clock signal.

2. The microprocessor circuit as recited in claim 1 wherein each of the distributed clock generator circuits generates a pair of clock signals that are 180 degrees out of phase.

3. The microprocessor circuit as recited in claim 1 wherein the timing signal source includes a duty cycle control circuit coupled to the frequency division circuit that regulates the first and second timing signals to have substantially a fifty percent duty cycle.

4. The microprocessor circuit as recited in claim 1 wherein a first routing line that couples the master timing signal from the master timing distribution circuit to a first distributed clock generator circuit has a length that is substantially the same as a length of a second routing line that couples the master timing signal from the master timing distribution circuit to a second distributed clock generator circuit.

5. The microprocessor circuit as recited in claim 1 wherein each distributed clock generator circuit includes a first driver circuit and a second driver circuit coupled in parallel with the first driver circuit.

6. The microprocessor circuit as recited in claim 5 wherein the second driver circuit of each distributed clock circuit is capable of being selectively enabled to vary a drive strength of said each distributed clock generator circuit.

7. A method of generating clock signals for driving a microprocessor circuit comprising the steps of:
    generating a master timing signal;
    synchronously applying the master timing signal to a plurality of clock generator circuits distributed across a semiconductor die and coupled to respective separate portions of the microprocessor circuit;
    applying respective distributed clock signals generated by said plurality of clock generator circuits to the respective separate portions of the microprocessor circuit;
    varying a frequency of said master timing signal; and
    varying a drive strength of each clock generator circuit between a high drive strength and a low drive strength depending upon a selected frequency of said master timing signal.

8. A method as recited in claim 7 wherein the clock generator circuits are distributed so that lines for synchronously applying the master timing signal to the clock generator circuits are configured to have approximately equal lengths.

9. A method as recited in claim 7 wherein the clock generator circuits are distributed so that each portion is loaded approximately equally with respect to the others.

10. A method as recited in claim 7 wherein the drive strength of each clock generator circuit is increased in response to an increase in the frequency of said master timing signal.

11. A microprocessor circuit fabricated on a semiconductor die comprising:
- a plurality of distributed circuit segments having substantially equal drive strength requirements, each segment further comprising:
  - a circuit area including circuitry driven by a clock signal, and
  - a distributed clock generator circuit fabricated at a distributed location on the semiconductor die and coupled to the circuitry within the circuit area to supply the clock signal thereto;
- a master timing distribution circuit coupled to the distributed clock generator circuits for supplying a master timing signal having a selectively variable frequency to each distributed clock generator circuit; and
- means for supplying a drive control signal to each distributed clock generator circuit of the plurality of distributed circuit segments for setting the drive strength of each distributed clock generator circuit;
- wherein each distributed clock generator circuit includes a first driver circuit and a second driver circuit coupled in parallel with the first driver circuit, and wherein the second driver circuit of each distributed clock circuit is capable of being selectively enabled to vary a drive strength of said each distributed clock generator circuit.

12. The microprocessor circuit as recited in claim 11 further comprising a selector having an output coupled to the master timing distribution circuit for controlling a frequency of said master timing signal.

13. The microprocessor as recited in claim 12 wherein the selector is controllable by software programming.

* * * * *

UNITED STATES PATENT AND TRADEMARK OFFICE
CERTIFICATE OF CORRECTION

PATENT NO. : 5,444,407
DATED : August 22, 1995
INVENTOR(S) : Ganapathy, et al

It is certified that error appears in the above-indentified patent and that said Letters Patent is hereby corrected as shown below:

Claim 1, col. 11, line 62, before "plurality" insert --a--.

Signed and Sealed this

Twentieth Day of February, 1996

Attest:

BRUCE LEHMAN

Attesting Officer           Commissioner of Patents and Trademarks